United States Patent
Hermes et al.

(10) Patent No.: US 8,963,193 B2
(45) Date of Patent: Feb. 24, 2015

(54) OPTO-ELECTRIC DEVICE AND METHOD OF MANUFACTURING THEREOF

(75) Inventors: Dorothee Christine Hermes, Herten (NL); Joanne Sarah Wilson, Dordrecht (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 130 days.

(21) Appl. No.: 13/704,644

(22) PCT Filed: Jun. 17, 2011

(86) PCT No.: PCT/NL2011/050438
§ 371 (c)(1),
(2), (4) Date: Apr. 15, 2013

(87) PCT Pub. No.: WO2011/159160
PCT Pub. Date: Dec. 22, 2011

(65) Prior Publication Data
US 2013/0214255 A1 Aug. 22, 2013

(30) Foreign Application Priority Data
Jun. 17, 2010 (EP) .................................... 10166379

(51) Int. Cl.
*H01L 33/00* (2010.01)
*H01L 51/52* (2006.01)
(Continued)

(52) U.S. Cl.
CPC ........ *H01L 51/5203* (2013.01); *H01L 51/5221* (2013.01); *H01L 33/36* (2013.01); *H01L 51/56* (2013.01); *H01L 51/5092* (2013.01); *H01L 2251/5315* (2013.01)
USPC ............................ 257/99; 438/34

(58) Field of Classification Search
CPC ........................... H01L 51/5203; H01L 51/56
USPC ......................... 257/99, 103; 438/34
See application file for complete search history.

(56) References Cited

U.S. PATENT DOCUMENTS

| 7,115,216 B2 | 10/2006 | Carter et al. |
| 2002/0013013 A1 | 1/2002 | Victor et al. |
| 2003/0153141 A1 | 8/2003 | Carter et al. |

(Continued)

FOREIGN PATENT DOCUMENTS

| DE | 102004013449 B3 | 12/2005 |
| EP | 0 331 997 A1 | 9/1989 |

(Continued)

OTHER PUBLICATIONS

Press release—Agfa Materials—Low-cost, large-area production of flexible OLEDs a step closer—Apr. 7, 2009.
International Search Report—PCT/NL2011/050438—Mailing date: Aug. 3, 2011.

*Primary Examiner* — Mark Prenty
(74) *Attorney, Agent, or Firm* — Banner & Witcoff, Ltd.

(57) ABSTRACT

The present invention relates to an opto-electric device having a stack of layers subsequently comprising
 a first electrode layer (20) of a material having a first work function, deposited on a substrate (10) or forming a substrate (20),
 an organic opto-electric layer (30) on the first electrode layer (20),
 a patterned electrically conductive layer (40) printed on the opto-electric layer (30),
 a transparent, second electrode layer (50) of a material having a second work function on the opto-electric layer (30) provided with the patterned electrically conductive layer (40), the second work function having a value lower than the first work function.

10 Claims, 10 Drawing Sheets

(51) Int. Cl.
*H01L 33/36* (2010.01)
*H01L 51/56* (2006.01)
*H01L 51/50* (2006.01)

(56) References Cited

U.S. PATENT DOCUMENTS

| | | |
|---|---|---|
| 2004/0178722 A1 | 9/2004 | Cok et al. |
| 2006/0279202 A1 | 12/2006 | Sakamoto et al. |
| 2007/0085471 A1 | 4/2007 | Cok |
| 2013/0214255 A1* | 8/2013 | Hermes et al. .................. 257/40 |
| 2014/0021463 A1* | 1/2014 | Nakamura et al. .............. 257/40 |

FOREIGN PATENT DOCUMENTS

| | | |
|---|---|---|
| EP | 0 845 924 A2 | 6/1998 |
| JP | 2006 147190 A | 6/2006 |
| WO | 2004086464 A2 | 10/2004 |
| WO | 2007004115 A2 | 1/2007 |
| WO | 2007036850 A2 | 4/2007 |
| WO | 2007041116 A1 | 4/2007 |
| WO | 2007115651 A1 | 10/2007 |
| WO | 2009001241 A1 | 12/2008 |
| WO | 2009004560 A2 | 1/2009 |
| WO | 2009007899 A1 | 1/2009 |

* cited by examiner

OPTO-ELECTRIC DEVICE AND METHOD OF MANUFACTURING THEREOF

CROSS-REFERENCE TO RELATED APPLICATIONS

This application is a U.S. National Stage application under 35 U.S.C. §371 of International Application PCT/NL2011/050438 (published as WO 2011/159160 A1), filed Jun. 17, 2011, which claims priority to Application EP 10166379.7, filed Jun. 17, 2010. Benefit of the filing date of each of these prior applications is hereby claimed. Each of these prior applications is hereby incorporated by reference in its entirety.

BACKGROUND OF THE INVENTION

1. Field of the Invention

The present invention relates to an opto-electric device.

The present invention further relates to a method of manufacturing an opto-electric device.

2. Related Art

An opto-electric device is a device that provides for an optical effect in response to an electric signal, or that generates an electric signal in response to an optical stimulus. Examples of the first are light emitting diodes, such as organic light emitting diodes. Nowadays various photoactive materials are known that convert an electric current into photon radiation. Photoactive materials may typically be any organic electroluminescent ("EL") material, including, but not limited to, small molecule organic fluorescent compounds, fluorescent and phosphorescent metal complexes, conjugated polymers, and combinations or mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly (phenylenevinylenes), polyfluorenes, poly(spirobifluorenes), polythiophenes, poly(p-phenylenes), copolymers thereof, and may further include combinations or mixtures thereof. The choice of a particular material may depend on the specific application, potentials used during operation, or other factors.

For large area OLED lighting on flexible plastic substrates, a large current is required to drive the system. The present thin film materials used for the semitransparent electrode (e.g. ITO) have a large resistivity and the large currents give rise to a substantial voltage drop, which results in inhomogeneous light emission. The conductivity of the electrode layers could be improved by increasing their thickness. However, the thickness of the transparent electrode layer cannot be increased too much in order to avoid an unacceptably low transparency. The transparent electrode should transmit a substantial amount, i.e. at least 50%, preferably at least 80% of photon radiation impingent thereon. This can be photon radiation rendered by the opto-electric layer for transmission to outside the device, or can be photon radiation from outside the device for transmission to the opto-electric layer.

Accordingly for producing large area flexible OLED devices on plastic substrates there is a need for an electrically conductive structure to support the transparent electrode. For reducing the manufacturing costs, such structured metallization coatings will preferably be applied on rolls of plastic foil using an inline roll-to-roll web coating process.

Accordingly, for opto-electric devices, such as light emitting devices and electro-chromic devices, but also for photovoltaic products there is a need for a metallization structure that on the one hand has a good electrical conductivity, while on the other hand has a high transmission for radiation.

WO2007/036850 describes an organic diode device that comprises an organic diode structure having an anode layer, a cathode layer and an organic layer. At least one of the anode layer and the cathode layer has a set of contact areas that are distributed over a face of said structure. A barrier layer hermetically covers said structure and is provided with a set of openings aligned with said set of contact areas. A metal conductor has been electroplated on said barrier layer and contacts the set of contact areas via the set of openings.

The electroplated metal conductor shunts the anode and the cathode, and therewith provides for an even voltage distribution over the area of a large organic diode device and therewith an even luminance.

SUMMARY OF THE INVENTION

It is a purpose of the invention to provide a more efficient method to manufacture an opto-electric device, as well as an opto-electric device that can be manufactured more efficiently.

According to a first aspect of the invention there is provided a method for manufacturing an opto-electric device comprising the subsequent steps of providing a first electrode layer of a material having a first workfunction, providing an organic opto-electric layer on the first electrode layer, printing a patterned electrically conductive layer on the organic functional layer, providing a transparent, second electrode layer of a material having a second work function lower than the workfunction of the first electrode on the organic layer provided with the patterned electrically conductive layer.

The wording subsequent indicates that the steps are carried out in the order presented. However two mutually subsequent steps may be intervened by one or more other additional steps.

It is noted that EP0845924A2 discloses transparent, organic EL devices comprising an positive electrode, a negative electrode and an organic layer including an organic light-emitting layer as sandwiched between the two electrodes, in which the negative electrode is comprised of an electron injection electrode layer and an amorphous transparent conductive film, and the electron injection electrode layer is adjacent to the organic layer, or in which the negative electrode is comprised of an electron injection electrode layer, a transparent conductive film and a thin metal film having a specific resistance of not larger than $1\times10^{-5}$ $\Omega\cdot$cm, as laminated in that order with the electron injection electrode layer being adjacent to the organic layer, and a thin transparent film is formed outside the negative electrode. The electron injection layer identified with reference numeral 6 in EP0845924A2 is an island-like electron injection zone. The wording "island-like" therein is meant to indicate a structure comprising discontinuous electron-injecting compound layers formed on the organic layer. Accordingly, although the electron-injection layer is a patterned layer formed of an electrically conductive-material, the electron-injection layer can not be considered as an electrically conductive layer due to its partitioning in island like zones.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component. As used herein a layer can also include multiple sub-layers. A layer can also consist of a collection of discrete portions, for example, a layer of discrete active regions comprising individual pixels.

In an OLED the electrode having the higher work-function serves as the anode. The anode is an electrode that is particularly efficient for injecting positive charge carriers. It can be made of for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also comprise an organic material such as polyanilines as described in "Flexible light-emitting diodes made from soluble conducting polymer," Nature vol. 357, pp 477479 (11 Jun. 1992). At least one of the anode and cathode should be at least partially transparent to allow the generated light to be observed. In the case where the transparent electrode is the electrode facing a substrate of the device the substrate must also then be transparent. In the case where the whole device has to be transparent, each of the layers within the device and the substrate has to be transparent In an OLED the electrode having the lowest work-function serves as the cathode. In this context a material is considered to have a low work-function if it has a work function not greater than about 4.4 eV. For that purpose metals or nonmetals may be used Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, silver, indium, yttrium, and combinations thereof, may also be used. Specific non-limiting examples of materials for the cathode layer include, but are not limited to, barium, lithium, cerium, cesium, europium, rubidium, yttrium, magnesium, samarium, and alloys and combinations thereof. The cathode layer may be formed as a combination of sub-layers, e.g. a layer of Ba having a thickness of about 5 nm facing the towards the opto-electric layer combined with a layer of aluminium having a thickness in the range of 10-400 nm facing away from the opto-electric layer.

In particular the presence of the electrode having the lowest work-function complicates the manufacturing of the device, as materials having a low work-function usually rapidly react with oxygen and water vapor in the atmosphere and as a result become insulating. Accordingly the second electrode layer has to be applied in a conditioned, i.e. an inert or a vacuum environment to prevent such corrosion. The cathode layer is usually formed by a chemical or physical vapor deposition process. Similarly, in practice subsequent layers and other features have to be deposited in a conditioned environment as oxygen or water vapor could reach the deposited electrode directly or through diffusion via the already deposited layers.

As in the method according to the first aspect of the invention the patterned electrically conductive layer is printed before the deposition of the transparent electrode, there are no limitations in this respect on the deposition method to be used for the patterned electrically conductive layer. It is for example not necessary that the patterned electrically conductive layer is applied in a conditioned environment. This facilitates using a deposition method suitable for large scale manufacturing, e.g. suitable for roll to roll processing. Examples of printing methods suitable for use in a roll to roll process are ink-jet printing and screen printing.

It is noted that EP 331997 considers in its description of the background prior art printing an auxiliary electrode. Contrary to the present invention however, the auxiliary layer is printed onto a separate transparent electrically conductive film. Subsequently the transparent electrically conductive film with the printed electrode is bonded with the luminescent layer. As an improvement EP 331997 considers a lamination process, wherein an electrically conductive strip is laminated between a substrate in the form of a continuous web having a.o. a luminescent layer, a transparent conductive film in the form of a continuous web, and an auxiliary electrode having a width narrower than that of each of said substrate and said transparent conductive film. Accordingly EP 331997 does not suggest a method of manufacturing a method of manufacturing an opto-electric device wherein a patterned electrically conductive layer is printed on the organic functional layer to avoid that a transparent, second electrode layer of a material having a second work function lower than the workfunction of the first electrode is damaged by the deposition of the patterned electrically conductive layer.

In an embodiment of the method according to the first aspect inkjet printing is used as the printing method.

Various materials are possible for use as the patterned electrically conductive layer and may be applied accordingly.

The patterned electrically conductive layer may for example be of a metal or a metal alloy that is applied in liquid form by inkjet printing. Various metals and metal alloys are available that have a relatively low melting point or melting trajectory.

Dependent on the temperature range wherein the opto-electric device is used and the temperature range allowed by the opto-electric layer the skilled person may select the most suitable metal or metal alloy from a variety of metals and metal alloys. For example the skilled person may select for example from commercially available, low cost, low-melting metals and metal alloys. These may comprise for example elements selected from the group consisting of In, Sn, Bi, Pb, Hg, Ga and Cd. Apart from a broad spectrum of melting points, said metals also offer a broad spectrum of other properties which are important, such as sensitivity to oxidation, adhesion to other materials, coefficient of thermal expansion, ductility, dimensional stability, degree of shrinkage upon solidification and wetting. In applications in which toxicity is an important factor, alloys containing Hg or Cd, such as Sn: (50 wt. %): Pb (32 wt. %): Cd (18 wt. %) alloy are not to be preferred. If a somewhat flexible EL device is necessary, it is advantageous to use a ductile low-melting metal, such as indium (melting point 157 C) or Sn (35.7 wt. %): Bi (35.7 wt. %): Pb (28.6 wt. %), which has a melting point of 100 C. To minimize stresses caused by solidification, a metal which, upon solidification, does not form crystalline domains and exhibits little shrinkage, such as Bi (58 wt. %): Sn (42 wt. %), melting point 138 C, is preferred.

Alternatively the patterned electrically conductive layer may be applied in the form of suspension or colloidal solution of metal particles or organic metal complexes. Likewise the suspension or colloidal solution may be applied by means of ink jet printing.

Although not always necessary the suspension or colloidal solution to be printed may be heated to facilitate the printing process, for example in a range between 100 and 300° C.

Nanoparticles from silver, copper, platinum and/or gold or organic metal complexes may be used in the suspension or colloidal solution to the formation of the auxiliary conductive strip. The nanoparticles preferably exhibit a diameter between 1 nm and 100 nm. Depending upon size and nature of the metal particles the used ink can be also a colloidal solution. An example thereof is a silver nanoparticle dispersion in an ethylene glycol/ethanol mixture as provided by Cabot (Cabot Printing Electronics and Displays, USA). This silver ink contains 20 wt % of silver nanoparticles, with the particle diameter ranging from 30 to 50 nm. The viscosity and surface tension of this ink is 14.4 mPa·s and 31 mN m$^{-1}$, respectively.

Alternatively metal complexes in organic or water based solvents may be used as the substance. Metal complexes may comprise organic silver, copper, platinum or gold complexes or of a mixture of these complexes. For example silver complex inks may be used comprising a mixture of solvents and silver amides, for example inks produced by InkTec. The silver amides decompose at a certain temperature between 130-150° C. into silver atoms, volatile amines and carbon dioxide. Once the solvents and the amines are evaporated, the silver atoms remain on the substrate. Other metal complexes based for example on copper, nickel, zinc, cobalt, palladium, gold, vanadium, and bismuth instead of silver may be used alternatively or in combination.

Other metal complexes based for example on copper, nickel, zinc, aluminum, cobalt, palladium, gold, vanadium, and bismuth instead of silver may be used alternatively or in combination. However, particularly suitable are a silver complex, a copper complex, a nickel-complex, an aluminum-complex or any mixture thereof. Silver, copper, aluminum and nickel are excellent conductors.

Some examples of copper complex based substances are shown in the following table.

TABLE 1

Examples of substances comprising a Cu-complex component

Cu(neodecanoate)2 (6-12% Cu; from Strem Chemicals)
Cu(acetate)2•H2O (from Sigma Aldrich)
complex with ethanolamine is soluble in water (concentration N/A)
Cu(formate)2•4 H2O (from Gelest)

The patterned electrically conductive layer may alternatively be a conductive polymer structure. Such a structure can be formed from a substance that comprises conductive polymer particles, for example suspended in a liquid. Examples of electrically conductive polymers are poly-(3,4-ethylenedioxythiophene) (PEDOT) or polyaniline (PANI). Instead a substance comprising a suspension of particles of a precursor for a conductive polymer may be used. However, generally, metals or alloys thereof (e.g. deposited in the form of a suspension) are more suitable for this purpose as they have a relatively good conductivity in comparison to organic substances.

In still other embodiments a solution with molecular metal precursors, and/or with conductive organic compounds, and/or with a precursor for a conductive organic compound may be deposited to form the patterned electrically conductive layer.

Typical mean particle diameters are in a range between 1 nm and 100 µm, preferably 1 nm-1 µm, very preferred 1 nm-100 nm and especially preferred 1 nm-50 nm. The mean particle diameter can be determined by transmission electron microscope (TEM). Very suitable are metal nanoparticles as they allow the formation of conducting surface patterns with a minimum amount of electromagnetic energy.

In a particular embodiment, the suspension or colloidal solution may be printed in a narrow line structure if the surface of the opto-electric layer is prepared with a surface energy modifying agent. Dependent on the surface energy in of the surface where the suspension or colloidal solution is applied, contact angles in the range of 30 deg to 60 deg may be realized. The inkjet printer used may eject the substance to be printed in the form of drops that merge into a continuous pattern, or may print a continuous beam of the substance to be printed at the surface. In an embodiment the process of printing is repeated. Therewith a relative high aspect ratio (height/width ratio) of the printed pattern can be achieved.

An embodiment of the method according to the first aspect further comprises the step of locally depositing an insulating material onto the opto-electric layer in a pattern at least substantially coextensive with the pattern to be formed by the patterned electrically conductive layer. The wording "at least substantially coextensive with" is understood to mean that the pattern of the insulating layer is coextensive with that of the patterned electrically conductive layer or that the features of the insulating layer laterally extend beyond the features formed by the patterned electrically conductive layer. Typically the features of the patterns are lineshaped, and the lineshaped features of the insulating layer should not extend laterally more than by 20% of the width of the lineshaped features of the patterned electrically conductive layer. The insulating layer may be formed from a resin material such as an acrylate and is deposited by using a technique which allows patterning such as inkjet printing or screen printing. The thickness of this material may be between 1 and 20 µm and should have a cross-sectional profile such that the deposited cathode can make electrical contact to both the deposited patterned electrically conductive layer and the opto-electric layer.

Alternatively, the step of locally depositing an insulating material in a pattern at least substantially coextensive with the pattern to be formed by the patterned electrically conductive layer precedes the step of providing an organic opto-electric layer on the first electrode layer. Accordingly, the patterned electrically insulating layer so formed is arranged between the first electrode-layer and the organic opto-electric layer.

Depending on its application, the opto-electric device may be flexible or rigid. The opto-electric device may be arranged in a housing that provides protection for moisture and oxygen. The housing may include a getter material. In the absence of housing the opto-electric device may be provided with one or more barrier layers for protection against moisture and oxygen.

A barrier layer typically comprises a stack of sub-layers. In a first embodiment the barrier layer is a stack comprising an organic layer sandwiched between a first and a second inorganic layer. The stack may comprise further organic and inorganic layers that alternate each other. The organic layers may comprise a moisture getter. Alternatively a barrier layer may comprise a stack of layers of different inorganic materials that alternate each other.

In some embodiments the opto-electric device may be applied on a substrate that has barrier functionality, e.g. a substrate of glass or of aluminium or stainless steel.

According to a second aspect there is provided an opto-electric device having a stack of layers subsequently comprising a first electrode layer (20) of a material having a first work function, deposited on a substrate (10) or forming a substrate (20), an organic opto-electric layer on the first electrode layer, a patterned electrically conductive layer on the opto-electric layer, a transparent, second electrode layer of a material having a second work function on the opto-electric layer provided with the patterned electrically conductive layer, the second work function having a value lower than the work function of the first electrode.

In the opto-electric device according to the invention the patterned electrically conductive layer is arranged between the opto-electric layer and the transparent electrically conductive layer forming the electrode having the lower workfunction. In case the opto-device includes a substrate, the transparent electrically conductive layer of the material having the relatively low work function is in practice arranged at a side opposite the side of the substrate. In an embodiment the opto-electric device may be removed from the substrate after completion of the manufacturing process. Accordingly, if the opto-electric layer in the device according to the second aspect of the invention is an electroluminescent layer (EL) the device according to the invention is a so-called top-emissive OLED. Nevertheless the device according to the invention may have in addition a first electrode that is transparent and that is shunted by an additional patterned electrically conductive layer.

The opto-electric device according the second aspect of the present invention can be manufactured by the method according to the first aspect of the invention.

In the opto-electric device according to the invention the first electrode layer may form the anode and the second (transparent) electrode layer may form the cathode or the other way around.

The device may have one or more optional buffer layers comprises buffer materials. The term "buffer layer" or "buffer material" is intended to mean electrically conductive or semi-conductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer materials may be polymers, oligomers, or small molecules, and may be in the form of solutions, dispersions, suspensions, emulsions, colloidal mixtures, or other compositions.

The buffer layer can be formed with polymeric materials, such as polyaniline (PANI) or polyethylenedioxythiophene (PEDOT), which are often doped with protonic acids. The protonic acids can be, for example, poly(styrenesulfonte acid), poly{2-acrylamido-2-methyl-1-propanesulfonic acid), and the like. The buffer layer can comprise charge transfer compounds, and the like, such as copper phthalocyanine and the tetrathiafulvalene-tetracyanoquinodimethane system (TTF-TCNQ).

In particular, in addition to the first electrode layer, the opto-electric layer, the patterned electrically conductive layer and the second, transparent, electrode layer, the opto-electric device according to the present invention may comprise a hole injection and/or transport layer (HTL) between the electrode layer forming the anode and the opto-electric layer and/or an electron injection and/or transport layer (ETL) between the electrode layer forming the cathode and the opto-electric layer. In the case where an electron transport layer is present, the patterned electrically conductive layer should be present between the electron transport layer and the cathode.

Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4', 4"-tris(N,N-diphenyl-amino)-triphenylamine (TDATA); 4,4', 4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino) phenyl]cyclohexane (TAPC); N,N'-bis(4-methylphenyl)-N, N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); a-phenyl-4-N,N-diphenylaminostyrene (TPS); p-(diethylamino) benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino) styryl]-5-[p-(diethylamino)phenyl]pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (a-NPB); and porphyrinic compounds, such as copper phthalocyanine Commonly used hole transporting polymers include, but are not limited to, poly(9,9-dioctyl-fluorene-co-N-(4-butylphenyl)diphenylamine), and the like, polyvinylcarbazole, (phenylmethyl)polysilane, poly (dioxythiophenes), polyanilines, and polypyrroles. Another example is polyethylene dioxythiophene (PEDOT). It is also possible to obtain hole transporting polymers by doping hole transporting molecules such as those mentioned above into polymers such as polystyrene and polycarbonate.

The electron transport, layer can function both to facilitate electron transport, and also serve as a buffer layer or confinement layer to prevent quenching of the exciton at layer interfaces. Preferably, this layer promotes electron mobility and reduces excitors quenching. Examples of electron transport materials which can be used in the optional electron transport layer, include metal chelated oxinoid compounds, including: metal quinolate derivatives such as tris(8-hydroxyquinolato) aluminum (AIQ), bis(2-methyl-8-quinolinotato)(p-phenylphenolato) aluminum (BAN), tetrakis-(8-hydroxyquinolato)hafnium (HfQ) and tetrakis-(8-hydroxyquinolato) zirconium (ZrQ); and azole compounds such as 2-(4-biplienyiyl)-5~(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaltne derivatives such as 2,3-bis(4-fluorophenyl)quinoxaline; phenanthrotines such as 4,7~diphenyl-1, 10~phenanthroline (DPA) and 2,9-dimethyl-4,7-diphenyl-1, 10-phenanthroline (DDPA); and mixtures thereof.

Accordingly, an embodiment of the opto-electric device according to the second aspect comprises a sequence of layers including an anode layer, HTL (layer), opto-electric layer, cathode. Another embodiment comprises anode, opto-electric layer, ETL (layer), cathode. Again another embodiment comprises anode, hole-transport layer, opto-electric layer, ETL (layer), cathode.

BRIEF DESCRIPTION OF THE DRAWINGS

These and other aspects are described in more detail with reference to the drawing. Therein:

FIG. 3A-3F show an embodiment of a method according to the first aspect of the invention, therein

DETAILED DESCRIPTION OF EMBODIMENTS

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

In the drawings, the size and relative sizes of layers and regions may be exaggerated for clarity.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Like elements have like reference numerals.

Figure 1:
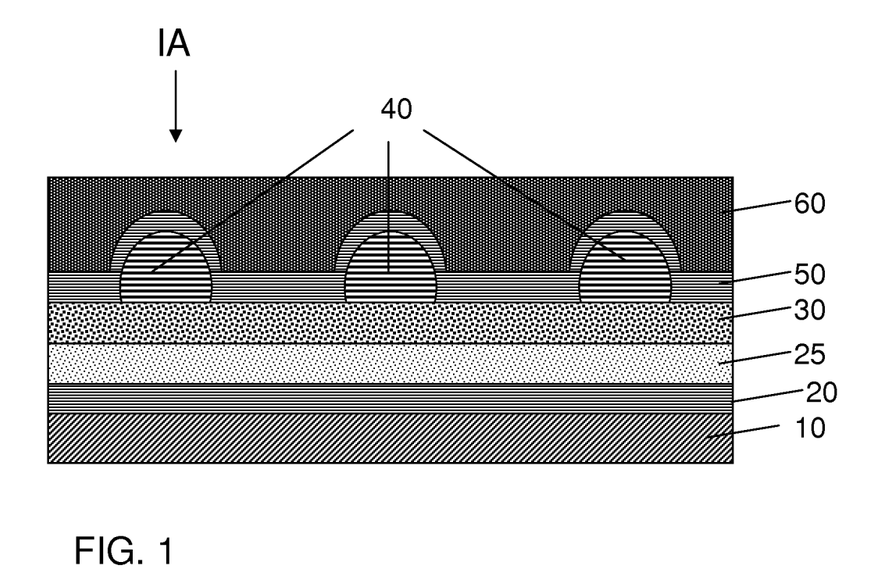
FIG. 1 shows a first embodiment of an opto-electric device according to the second aspect of the invention.

FIG. 1 schematically shows a first embodiment of an opto-electric device according to the second aspect of the present invention.

The electro-optic device comprises
a first electrode layer 20,
an organic electro-optic layer 30 on the first electrode layer 20,
a patterned electrically conductive layer 40 on the electro-optic layer 30,
a second, transparent, electrode layer 50 on the electro-optic layer 30 provided with the patterned electrically conductive layer 40.

The electro-optic device is applied on a substrate 10. The substrate 10 may for example be a rigid substrate, such as a glass plate. Alternatively the substrate may be a flexible substrate e.g. a substrate from a polymer, such as polyethylene terephthalate (PET), polyethylene naphthalate (PEN), polyimide (PI), polyetherimide (PEI), polyethersulfone (PES), polysulfone (PSF), polyphenylene sulfide (PPS), polyether ether ketone (PEEK), polyarylate (PAR), and polyamideimide (PAI). Other resin materials include polycycloolefin resin, acrylic resin, polystyrene, ABS, polyethylene, polypropylene, polyamide resin, polyvinyl chloride resin, polycarbonate resin, polyphenyleneether resin and cellulose resin, etc.

A polymer substrate is preferably provided with a barrier layer, e.g. between the substrate 10 and the first electrode 20. The barrier layer comprises for example a sequence of mutually different inorganic layers alternating each other, e.g. silicon nitride and silicon oxide layers. Alternatively the barrier layer may comprise at least a pair of inorganic layers that are mutually separated by an organic layer.

In this case the first electrode layer 20 forms an anode, and a hole injection layer (PEDOT) 25 is arranged between the anode 20 and the electro-optic layer. The free surface of the second (transparent) electrode 50 that forms the cathode is covered by a barrier layer 60.

Figure 1A:
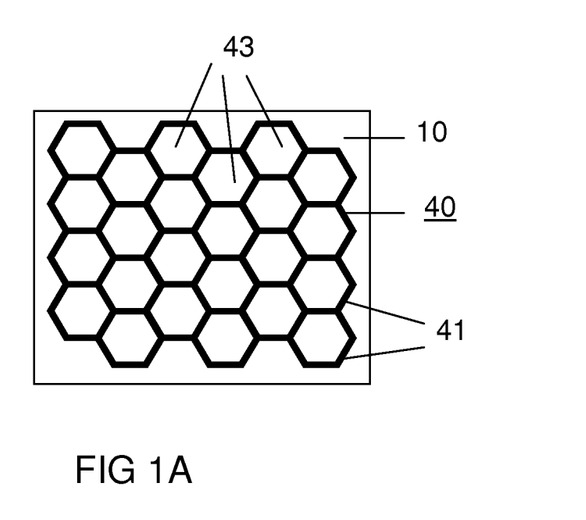
FIG. 1A shows a view of said embodiment according to IA in FIG. 1.

FIG. 1A shows in a top view according to IA in FIG. 1 the patterned electrically conductive layer 40. For clarity, apart from the substrate 10, no other parts are shown. In this embodiment the patterned electrically conductive layer is a hexagonal maze, having elongated electrically conductive elements 41 that define openings 43.

Figure 1B:
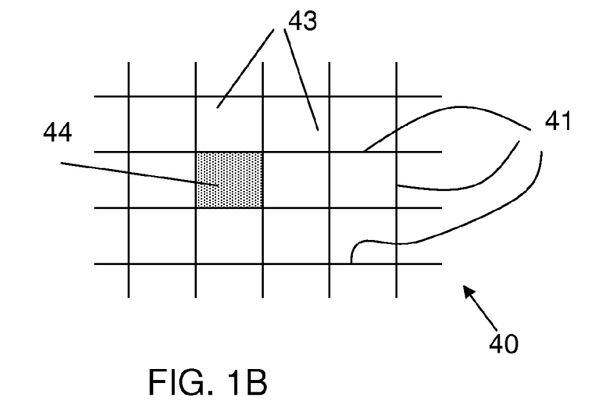
FIG. 1B shows a part of a first variation of said embodiment according to the same view.
Figure 1C:
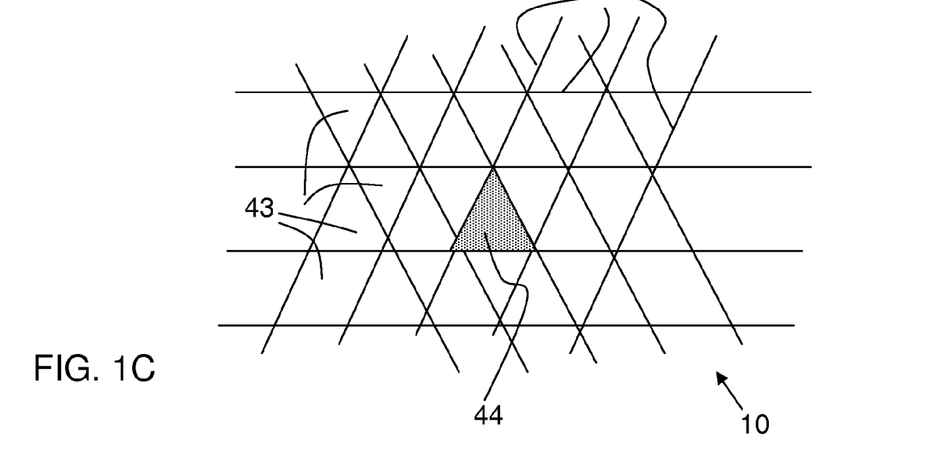
FIG. 1C shows a part of a second variation of said embodiment according to the same view.
Figure 1D:
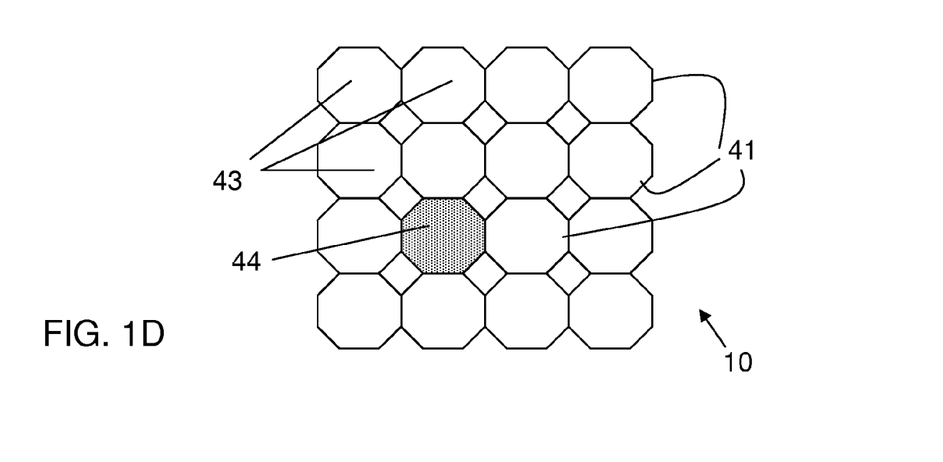
FIG. 1D shows a part of a third variation of said embodiment according to the same view.
Figure 1E:
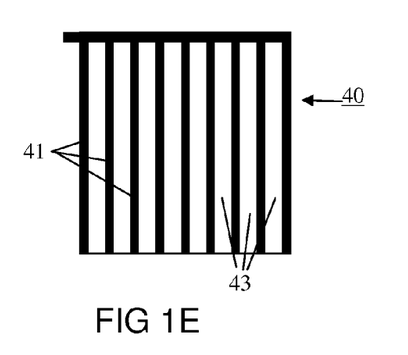
FIG. 1E shows a part of a fourth variation of said embodiment according to the same view.
Figure 1F:
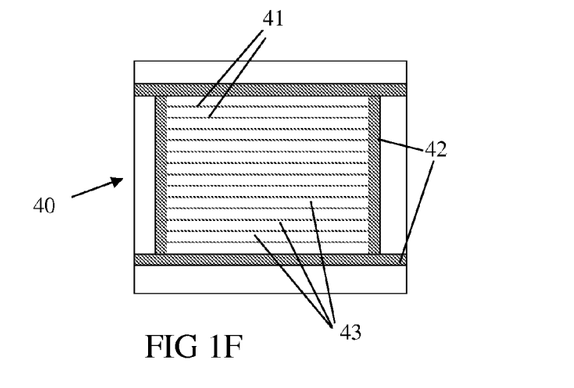
FIG. 1F shows a part of a fifth variation of said embodiment according to the same view.

However other embodiments are possible. For example a rectangular maze, as shown in FIG. 1B, a triangular maze as shown in FIG. 1C or an octagonal maze according to FIG. 1D. The electrically conductive layer may alternatively be patterned in the form of a plurality of parallel lines, as shown in FIG. 1E. The pattern of parallel lines may be coupled to relatively wide busbars as shown in FIG. 1F. In practice the pattern of the electrically conductive layer 40 comprises a plurality of regular spaced openings 43 to allow transmission of photon radiation. Preferably the openings are bounded by elongate conductive elements 41 extending in a plane defined by the patterned electrically conductive layer and said elongate conductive elements having in said plane a length that is at least 10 times their width. The conductive elements may have a height in the range of 0.001 to 10 times the width for example. As shown in FIGS. 1B, 1C and 1D, the patterned electrically conductive layer 40 may have contact fields 44, to facilitate application of an electrical contact between the patterned electrically conductive layer 40 and an external conductor. In a practical embodiment as shown in FIG. 1A to 1D the elongated electrically conductive elements 41 may have a length of about 0.5 to 5 mm, for example about 1 mm. In the embodiments shown in FIGS. 1E and 1F, the elongate electrically conductive elements 41 extend over the full width or length of the device and may be arranged at a distance of 0.5 mm to 5 mm for example, e.g. spaced at a distance of 1 mm from each other. The width of the elements is about 50 μm. However, depending on the application, another value for the width may be selected for example in the interval of 1 to 500 μm. Usually the elongate conductive elements have a height of a few μm. In the embodiment of FIG. 1F, the patterned electrically conductive layer 40 further comprises bus bars 42.

Figure 2:
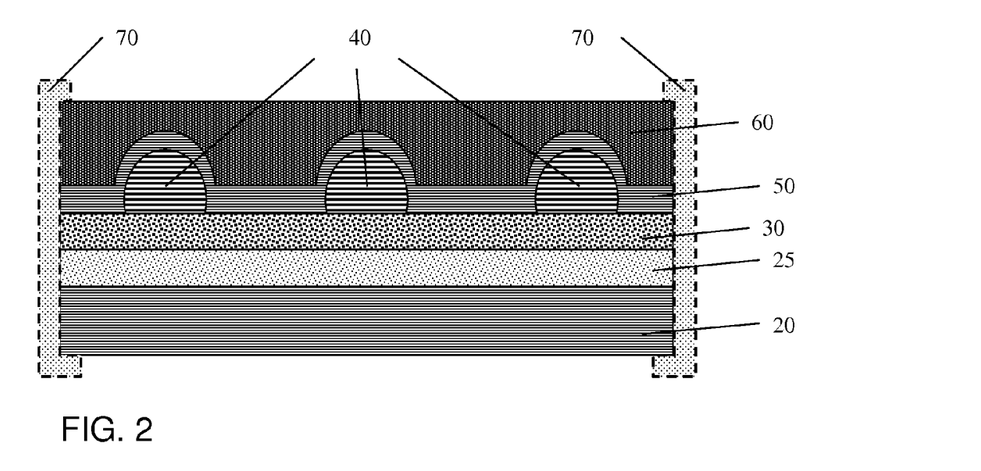
FIG. 2 shows a second embodiment of an opto-electric device according to the second aspect of the invention.

FIG. 2 shows an alternative embodiment of the device according to the invention. In this example the electrode 20 is carried out in the form of a metal foil, e.g. a steel foil having a thickness of 0.1 mm. The metal foil serving as the electrode also provides for a barrier against moisture and oxygen. Optionally the device may be sealed laterally with a sealing ring 70.

FIG. 3A to 3F shows an embodiment of a method according to the second aspect of the invention for manufacturing an opto-electric device. By way of example the method is used to manufacture the opto-electrical device schematically shown in FIG. 1 and having the patterned electrically conductive layer 40 as shown in FIG. 1F.

Figure 3A:
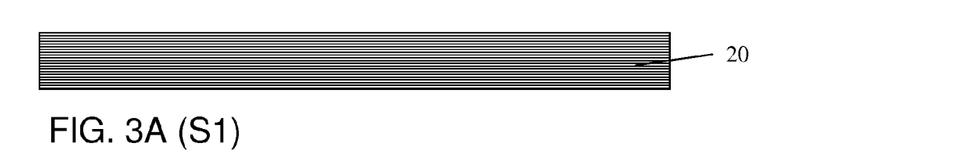
FIG. 3A shows the result of a first step (S1) of the method.

The embodiment of the method shown in FIG. 3A to 3F, comprises a first step S1, shown in FIG. 3A, wherein an electrode 20 is provided in the form of a stainless steel foil having a thickness of about 50 μm. Depending on the application a thinner metal foil, e.g. 20 μm or a thicker metal foil, e.g. 300 μm may be used. In this case the device has a size of 2×2 cm. The stainless steel foil serving as the electrode 20 also forms a substrate for the device, and functions as a barrier against moisture and oxygen. In another embodiment the device may be provided with a separate substrate e.g. a rigid substrate in the form of a glass plate or a flexible substrate e.g. in the form of a polymer foil, e.g. a foil from polyethylene therephtalate (PET) or polyethylene naphtalate (PEN). The polymer foil may be provided with a barrier layer, e.g. comprising a sequence of inorganic sub-layers of a different type, or inorganic sublayers separated by organic planarization layers.

Figure 3B:
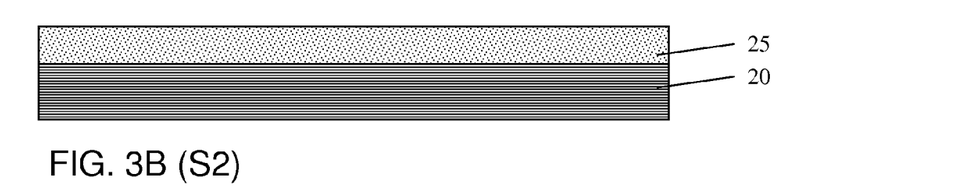
FIG. 3B shows the result of a second step (S2) of the method.

To improve efficiency of the device, a hole-injection layer 25 is provided in a second step S2 by spincoating. In this case the hole injection layer is a pedot (polyethylene dioxythiophene) layer having a thickness in the range of 10 to 500 nm, here a thickness of 100 nm.

Figure 3C:
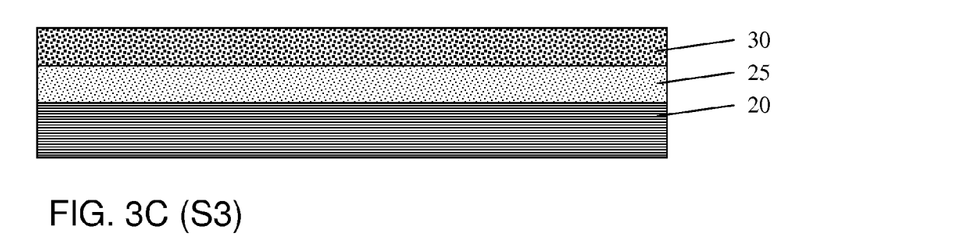
FIG. 3C shows the result of a third step (S3) of the method.

FIG. 3C shows a third step wherein an organic opto-electric layer 30, here yellow poly(para-phenylene vinylene) derivative is deposited by spin-coating on the first electrode layer 20 provided with the hole-injection layer 25. Nevertheless other polymer or small molecule electroluminescent materials may be used for the electroluminescent layer. The thickness of the organic opto-electric layer 30 may be varied in the range of 50 to 200 nm. In the present case it has a thickness of about 100 nm. In a fourth step S4, shown in FIG. 3D a patterned electrically conductive layer 40 is deposited on the organic opto-electric layer 30. The electrically conductive layer 40, patterned as shown in FIG. 1F is deposited by a printing process.

Figure 3D:
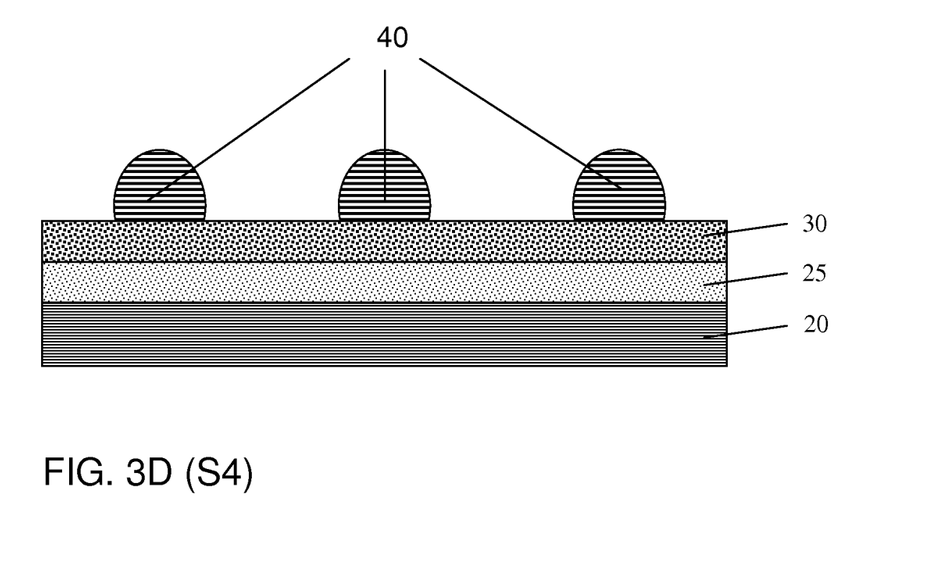
FIG. 3D shows the result of a fourth step (S4) of the method.

To that end a silver nanoparticle dispersion in an ethylene glycol/ethanol mixture was purchased from Cabot (Cabot Printing Electronics and Displays, USA). The silver ink contains 20 wt % of silver nanoparticles, with the particle diameter ranging from 30 to 50 nm. The viscosity and surface tension of the ink were 14.4 mPa·s and 31 mN m$^{-1}$, respectively.

The silver nanoparticle dispersion was applied at organic opto-electric layer 30 by inkjet printing using a piezoelectric inkjet printer of type Dimatix DMP 2800 (Dimatix-Fujifilm Inc., USA), equipped with a 10 pL cartridge (DMC-11610). The print head thereof contains 16 parallel squared nozzles with a diameter of 30 μm. The dispersion was printed using a customized wave form (average nozzle voltage 28 V, frequency of 20 kHz, meniscus set point 4 inches H2O, printing height 0.5 mm, drop spacing of 20 μm). The line width was set to a value of 100 μm. The patterned electrically conductive layer 40 was printed in the form of a series of mutually parallel lines, regularly spaced at a distance of 1 mm from each other. This printing step was carried out under atmospheric conditions.

Figure 3E:
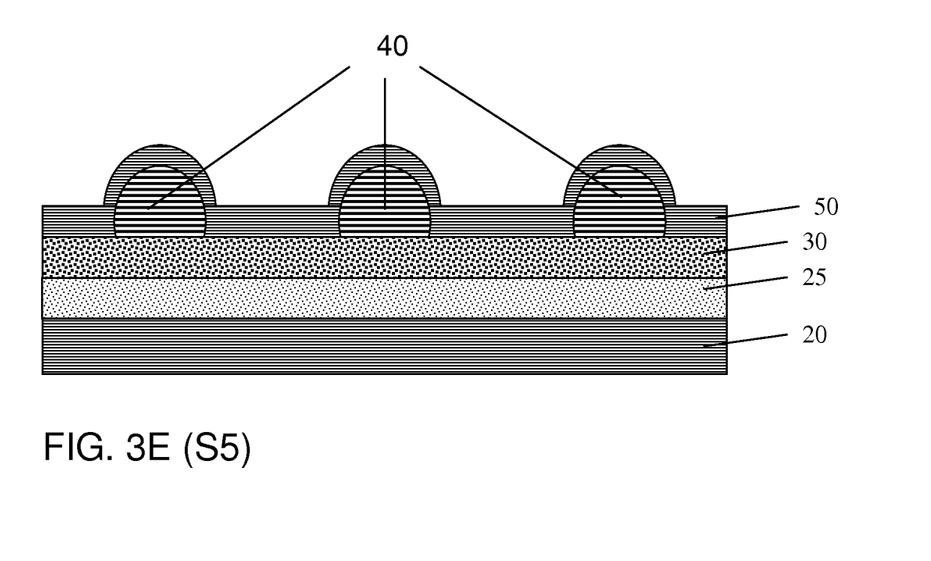
FIG. 3E shows the result of a fifth step (S5) of the method.

In a fifth step, shown in FIG. 3E, a second, transparent, electrode layer 50 is provided on the organic opto-electric layer 30 layer provided with the patterned electrically conductive layer 40. The second transparent electrode layer in this exemplary embodiment comprises a first and a second sublayer. The first sub-layer, closest to the organic opto-electric layer is formed by barium and has a thickness of 5 nm. The second sub-layer, more remote from the organic opto-electric layer is formed by ITO and has a thickness of 50 to 500 nm. In other embodiments the first sublayer may be formed of MgAg for example having a thickness of 5-40 nm. Alternatively or additionally other sublayers, of other materials, such as Li, copper phthalocyanine (CuPc), LiF, Al and Ag may be used. Instead of a sublayer of ITO, another transparent metal oxide, such as IZO, may be used for this sublayer.

Figure 3F:
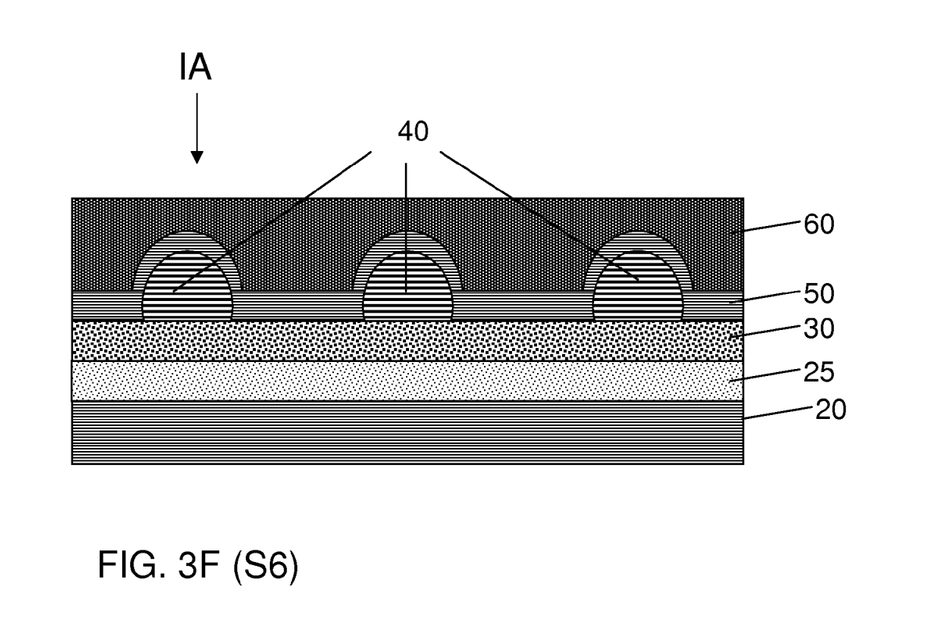
FIG. 3F shows the result of a sixth step (S1) of the method.

Finally in step S6, sown in FIG. 3F, a barrier layer 60 comprising a plurality of sub-layers (not shown) is deposited on the transparent, electrode layer 50.

Figure 6:
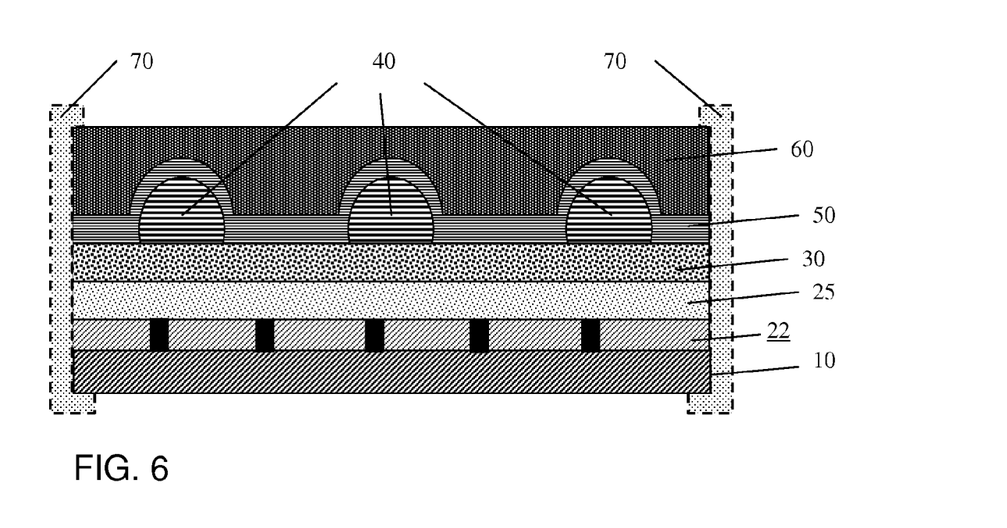
FIG. 6 shows an alternative embodiment of a device according to the second aspect of the invention.

Additionally the device may be laterally sealed by a sealing 70 as shown in FIGS. 2 and 6, to prevent a lateral diffusion of moisture and/or oxygen. Suitable materials for use as a sealant are epoxy resins or acrylate resins filled with inorganic particles. Alternatively a sealing may be provided by providing an extension of the barrier layers beyond the area of the functional layers between them, so that these barrier layers fully encapsulate these functional layers, as shown in FIG. 7A, or as shown in FIG. 7B, wherein a metal substrate 10 serves as the second barrier layer.

Figure 4:
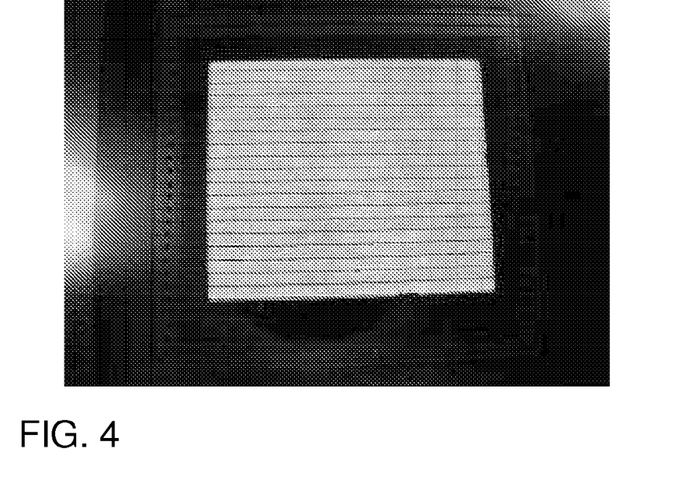
FIG. 4 shows a photograph of a device obtained with the method of FIG. 3A-3F.

FIG. 4 shows a photograph of the device obtained with the method described with reference to FIG. 3A to 3F.

Figure 5:
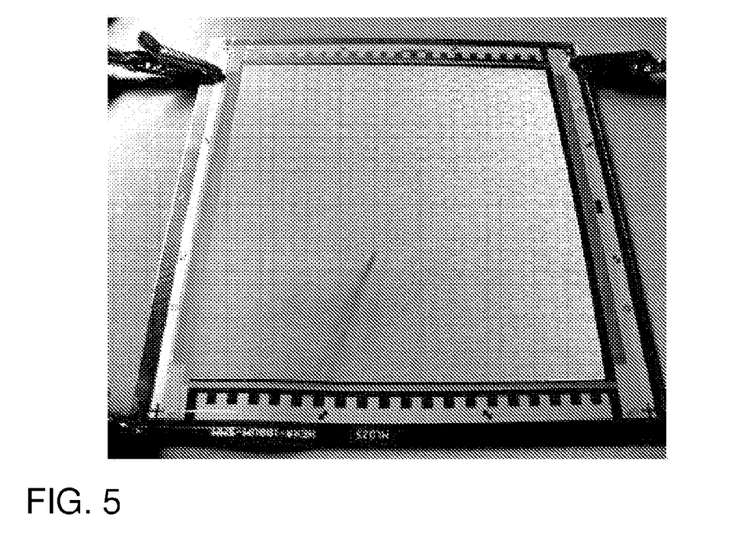
FIG. 5 shows a photograph of another device obtained with the method of FIG. 3A-3F.

FIG. 5 shows a photograph of another device obtained with the method of FIG. 3A-3F. In this device the substrate, also a steel foil, has a size of 15×15 cm. The patterned electrically conductive layer 40 is formed in a hexagonal maze structure as shown in FIG. 1A. The maze structure of the patterned electrically conductive layer 40 has elongated elements with a length of about 5 mm, a width of 100 μm and a height of 2 μm.

FIG. 6 shows a further embodiment of an opto-electric device according to the second aspect of the present invention. Therein the device is provided with a further shunting structure 22 in the form of a patterned electrically conductive layer that is embedded in a transparent material, as is described in patent Application EP2158176 filed by the same Applicant. This structure is shown in more detail in FIG. 6A. Reference numeral 10 denotes here a transparent substrate, such as a glass or a polymer plate.

Figure 6A:
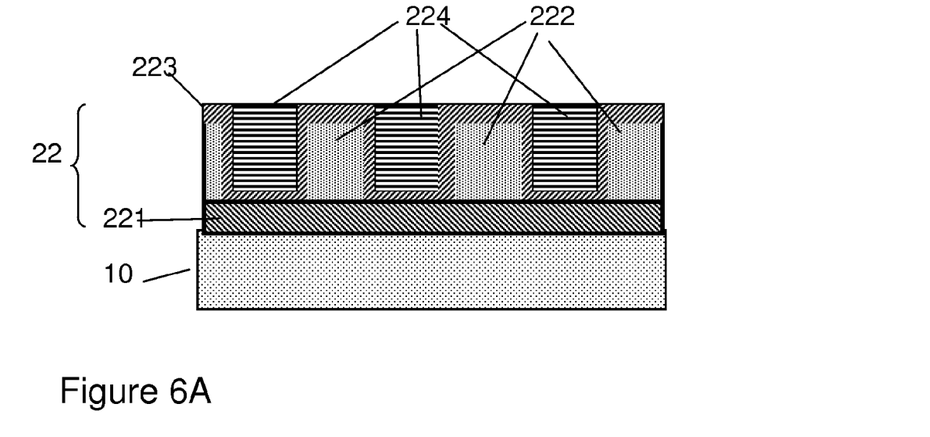
FIG. 6A shows a detail of FIG. 6.

As shown in FIG. 6A the further shunting structure 22 comprises a first inorganic layer 221, an organic layer 222, a second inorganic layer 223, and the patterned electrically conductive layer 224. The electrically conductive layer 224 may be patterned in a way as described with reference to FIGS. 1A to 1F for example.

Figure 7:
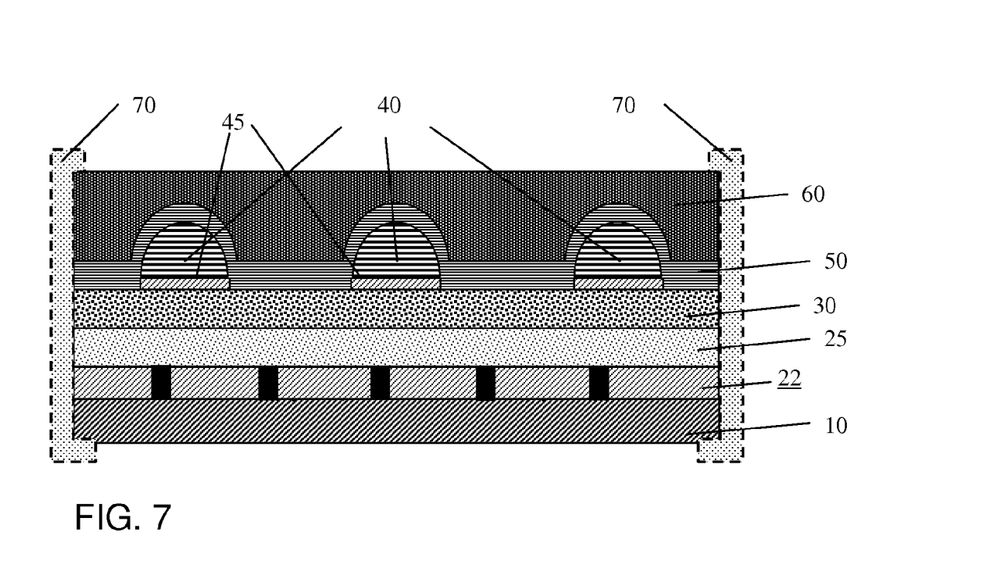
FIG. 7 shows a further alternative embodiment of a device according to the second aspect of the invention.
Figure 7A:
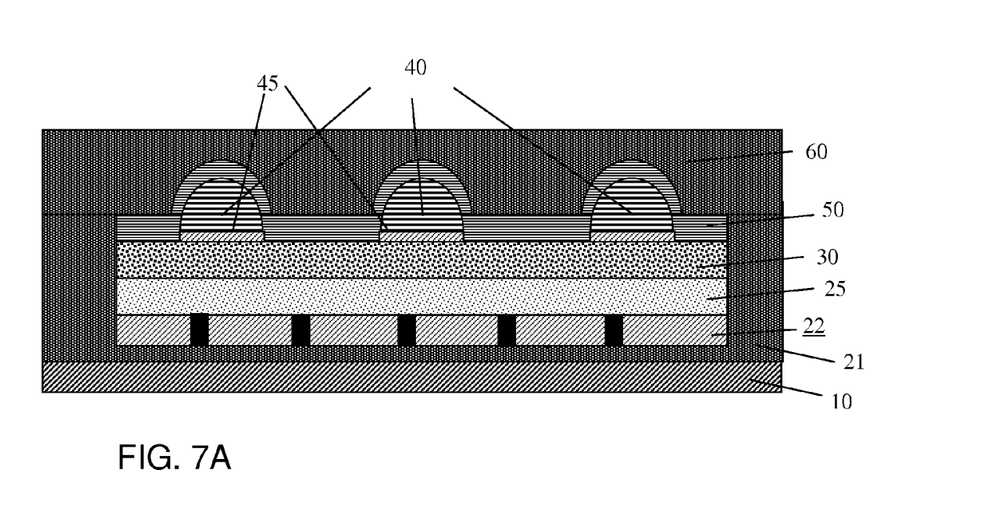
FIG. 7A shows a still further alternative embodiment of a device according to the second aspect of the invention.
Figure 7B:
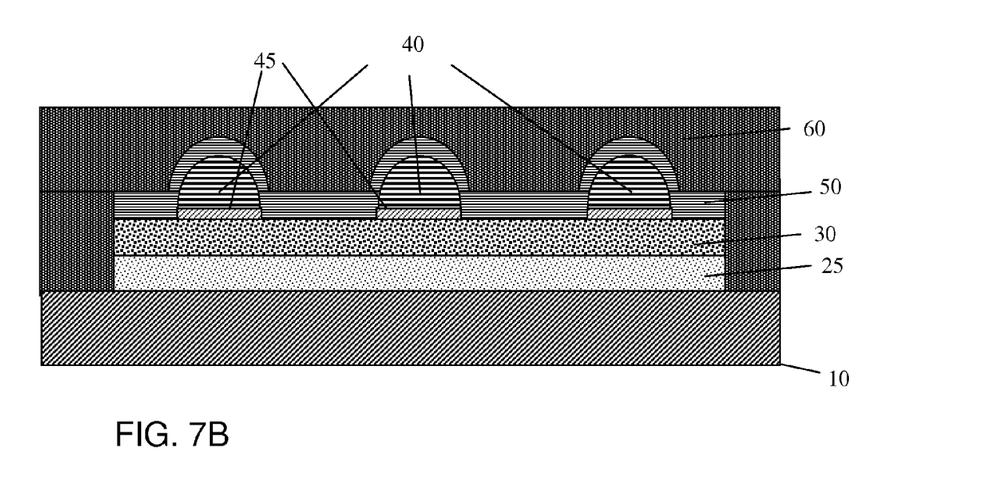
FIG. 7B shows again a further alternative embodiment of a device according to the second aspect of the invention.

FIG. 7 shows a still further embodiment of an opto-electric device according to the second aspect of the present invention. Therein the device is further provided with an insulating layer 45 that is patterned coextensive with the pattern of the patterned electrically conductive layer 40. The patterned insulating layer 45 helps to prevent electrical shorts in the device, as there is no direct contact between the patterned electrically conductive layer 40 and the opto-electric layer 30. The patterned electrically insulating layer 45 may have lineshaped features having a width that is up to 20% larger than the width of lineshaped features of the patterned electrically conductive layer 40, so that the patterned electrically insulating layer 45 laterally extends slightly beyond the patterned electrically conductive layer 40.

The opto-electric device of FIG. 7 has a further shunting structure 22 similar to that of FIGS. 6 and 6A.

FIG. 7A shows a still further alternative embodiment of a device according to the second aspect of the invention. In this further alternative embodiment the barrier layers 60 and 21 extend beyond the area used by the functional layers 22, 25, 30, 40, 45, 50 arranged between them. Therewith the barrier layers 21 and 60 fully encapsulate those functional layers.

FIG. 7B shows again a further alternative embodiment of a device according to the second aspect of the invention. In this further alternative embodiment the barrier layer 60 and the metal substrate 10, also serving as a barrier layer extend beyond the area used by the functional layers 22, 25, 30, 40, 45, 50 arranged between them. Therewith the barrier layer 60 and the metal substrate 10 fully encapsulate those functional layers.

Figure 7C:
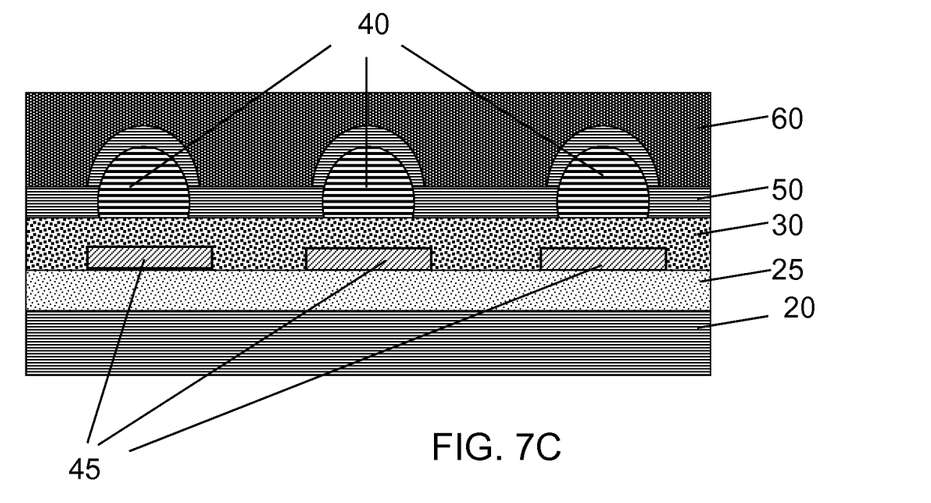
FIG. 7C shows another alternative embodiment of a device according to the second aspect of the invention.

FIG. 7C shows another alternative embodiment of a device according to the second aspect of the invention. The device shown in FIG. 7C is also obtained by a method that includes the step of locally depositing an insulating material in a pattern at least substantially coextensive with the pattern to be formed by the patterned electrically conductive layer. As in the embodiment of FIGS. 7A and 7B this step is performed after the step of providing (S1) a first electrode layer of a material having a first workfunction. However, here, the step of locally depositing an insulating material in a pattern at least substantially coextensive with the pattern to be formed by the patterned electrically conductive layer precedes the step of providing an organic opto-electric layer on the first electrode layer. Hence, in the embodiment of FIG. 7C, the patterned electrically insulating layer 45 so formed is arranged between the first electrode-layer 25 and the organic opto-electric layer 30.

As in the embodiment of FIG. 7A, 7B, the patterned electrically insulating layer 45 may have lineshaped features having a width that is up to 20% larger than the width of lineshaped features of the patterned electrically conductive layer 40, so that the patterned electrically insulating layer 45 laterally extends slightly beyond the patterned electrically conductive layer 40.

As in the embodiment of FIG. 7A, 7B, the patterned electrically insulating layer 45 prevents a direct electrical contact between the patterned electrically conductive layer 40 and the first electrode-layer 25 (e.g. a PEDOT layer). In the absence of a patterned electrically insulating layer 45 a solvent with conducting material could locally leak through the organic opto-electric layer 30 when printing the patterned electrically conductive layer 40 and cause a short. The patterned electrically insulating layer 45 prevents this phenomenon.

While the invention has been illustrated and described in detail in the drawings and foregoing description, such illustration and description are to be considered illustrative and exemplary and not restrictive; the invention is not limited to the disclosed embodiments.

Other variations to the disclosed embodiments can be understood and effected by those skilled in the art in practicing the claimed invention, from a study of the drawings, the disclosure and the appended claims.

For example, although the present invention is described in particular with reference to an electroluminescent device in the form of an OLED, the invention may also be applicable to other kinds of electroluminescent devices. Likewise the present invention is applicable to photovoltaic devices, electrochromic devices and displays.

In the claims the word "comprising" does not exclude other elements or steps, and the indefinite article "a" or "an" does not exclude a plurality. A single processor or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. Method for manufacturing an OLED device comprising the subsequent steps of
   providing a first electrode layer of a material having a first workfunction,
   providing an organic opto-electric layer on the first electrode layer,
   printing a patterned electrically conductive layer on the opto-electric layer,
   providing a transparent, second electrode layer of a material having a second work function lower than the workfunction of the first electrode on the organic layer provided with the patterned electrically conductive layer
   after the step of providing the first electrode layer, but before the step of printing the patterned electrically conductive layer, locally depositing an insulating material in a pattern at least substantially coextensive with the pattern to be formed by the patterned electrically conductive layer.

2. Method according to claim 1, further comprising providing a hole-injection layer subsequent to the step of providing a first electrode layer and preceding the step of providing an organic opto-electric layer.

3. Method according to claim 1 or 2, wherein the patterned electrically conductive layer is provided by ink-jet printing.

4. Method according to claim 1 or 2, wherein the patterned electrically conductive layer is provided by screen printing.

5. Method according to claim 1 or 2, wherein a surface of the opto-electric layer is prepared with a surface energy modifying agent.

6. Method according to claim 1 or 2, wherein the patterned electrically conductive layer is provided by printing a molten metal or alloy of metals.

7. Method according to claim 1 or 2, wherein the patterned electrically conductive layer is provided in the form of a suspension or colloidal solution of metal particles or organic metal complexes.

8. OLED device having a stack of layers comprising
- a first electrode layer of a material having a first work function,
- an organic opto-electric layer on the first electrode layer,
- a patterned electrically conductive layer printed on the opto-electric layer,
- a transparent, second electrode layer of a material having a second work function on the opto-electric layer provided with the patterned electrically conductive layer, the work function of the second electrode having a value lower than the work function of the first electrode,
- a patterned insulating layer being at least substantially coextensive with the patterned electrically conductive layer between the opto-electric layer and the patterned electrically conductive layer, or between the first electrode layer and the organic opto-electric layer.

9. OLED lighting device according to claim 8, wherein the first electrode layer is deposited on a substrate or forms a substrate.

10. OLED lighting device according to claim 8 or 9, wherein a hole injection layer is arranged between the first electrode and the patterned insulating layer.

* * * * *